(12) United States Patent
Huangfu et al.

(10) Patent No.: US 11,296,158 B2
(45) Date of Patent: Apr. 5, 2022

(54) PIXEL STRUCTURE INCLUDING A LATERAL REFLECTIVE LAYER

(71) Applicant: BOE Technology Group Co., Ltd., Beijing (CN)

(72) Inventors: Lujiang Huangfu, Beijing (CN); Xing Fan, Beijing (CN); Zheng Liu, Beijing (CN); Yan Fan, Beijing (CN); Liangjian Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 135 days.

(21) Appl. No.: 16/632,210

(22) PCT Filed: Nov. 28, 2018

(86) PCT No.: PCT/CN2018/117873
§ 371 (c)(1),
(2) Date: Jan. 17, 2020

(87) PCT Pub. No.: WO2020/107252
PCT Pub. Date: Jun. 4, 2020

(65) Prior Publication Data
US 2021/0225968 A1    Jul. 22, 2021

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 51/5209* (2013.01);
(Continued)

(58) Field of Classification Search
CPC ............. H01L 27/3246; H01L 51/5271; H01L 27/3258; H01L 51/5209; H01L 51/5225; H01L 51/56
(Continued)

(56) References Cited

U.S. PATENT DOCUMENTS 6,777,871 B2    8/2004   Duggal et al.
7,432,649 B2    10/2008  West
(Continued)

FOREIGN PATENT DOCUMENTS

CN    103219354 A    7/2013
CN    104241535 A    12/2014
(Continued)

OTHER PUBLICATIONS

International Search Report & Written Opinion dated Sep. 11, 2019, regarding PCT/CN2018/117873.

*Primary Examiner* — Robert T Huber
(74) *Attorney, Agent, or Firm* — Intellectual Valley Law, P.C.

(57) ABSTRACT

A pixel structure. The pixel structure includes a base substrate; an insulating island on the base substrate; a light emitting element on a side of the insulating island away from the base substrate; an insulating layer on the base substrate and surrounding the insulating island, the insulating layer spaced apart from the insulating island by a groove; and a reflective layer on a lateral side of the insulating layer surrounding a periphery of the light emitting element, and configured to reflect light laterally emitted from the light emitting element to exit from a light emitting surface of the pixel structure. The insulating layer has a height relative to a main surface of the base substrate greater than a height of
(Continued)

the insulating island relative to the main surface of the base substrate. The reflective layer is in direct contact with the base substrate in the groove.

19 Claims, 10 Drawing Sheets

(52) U.S. Cl.
CPC ...... *H01L 51/5225* (2013.01); *H01L 51/5271* (2013.01); *H01L 51/56* (2013.01)

(58) Field of Classification Search
USPC ........................................ 257/40, 98, 33.072
See application file for complete search history.

(56) References Cited

U.S. PATENT DOCUMENTS

| | | | |
|---|---|---|---|
| 8,373,341 B2 | 2/2013 | Xue et al. | |
| 8,538,224 B2 | 9/2013 | Lamansky et al. | |
| 8,987,767 B2 | 3/2015 | Lee et al. | |
| 9,508,957 B2 | 11/2016 | Forrest et al. | |
| 9,837,631 B2 | 12/2017 | Kim et al. | |
| 2004/0113550 A1* | 6/2004 | Adachi | H01L 51/5262 313/512 |
| 2004/0160165 A1* | 8/2004 | Yamauchi | H01L 51/5271 313/498 |
| 2008/0169461 A1* | 7/2008 | Park | H01L 51/5271 257/40 |
| 2008/0303419 A1 | 12/2008 | Fukuda | |
| 2013/0187163 A1 | 7/2013 | Kim et al. | |
| 2014/0361265 A1 | 12/2014 | Liu et al. | |
| 2015/0034656 A1 | 2/2015 | Chen | |
| 2016/0268554 A1 | 9/2016 | Wu et al. | |
| 2016/0359142 A1 | 12/2016 | Huangfu et al. | |
| 2018/0331325 A1 | 11/2018 | Zhang | |

FOREIGN PATENT DOCUMENTS

| | | |
|---|---|---|
| CN | 104733501 A | 6/2015 |
| CN | 204391161 U | 6/2015 |
| CN | 106941113 A | 7/2017 |
| CN | 109037493 A | 12/2018 |

\* cited by examiner

PIXEL STRUCTURE INCLUDING A LATERAL REFLECTIVE LAYER

CROSS-REFERENCE TO RELATED APPLICATION

This application is a national stage application under 35 U.S.C. § 371 of International Application No. PCT/CN2018/117873, filed Nov. 28, 2018, the contents of which are incorporated by reference in the entirety.

TECHNICAL FIELD

The present invention relates to display technology, more particularly, to a pixel structure, a display apparatus, and a method of fabricating a pixel structure.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

SUMMARY

In one aspect, the present invention provides a pixel structure, comprising a base substrate; an insulating island on the base substrate; a light emitting element on a side of the insulating island away from the base substrate; an insulating layer on the base substrate and surrounding the insulating island, the insulating layer spaced apart from the insulating island by a groove; and a reflective layer on a lateral side of the insulating layer surrounding a periphery of the light emitting element, and configured to reflect light laterally emitted from the light emitting element to exit from a light emitting surface of the pixel structure; wherein the insulating layer has a height relative to a main surface of the base substrate greater than a height of the insulating island relative to the main surface of the base substrate.

Optionally, the light emitting element comprises a first electrode, a light emitting layer on the first electrode, and a second electrode on a side of the light emitting layer away from the first electrode; the first electrode is disconnected from the reflective layer; and the height of the insulating layer relative to the main surface of the base substrate is greater than a height of the light emitting layer relative to the main surface of the base substrate in a region sandwiched between the first electrode and the second electrode.

Optionally, the pixel structure further comprises a pixel definition layer defining a pixel aperture; wherein the light emitting layer is in the pixel aperture; and the pixel definition layer is on a side of the first electrode away from the insulating island.

Optionally, the pixel definition layer is at least partially in the groove, spacing apart the insulating layer and the reflective layer from the insulating island.

Optionally, the pixel definition layer is substantially outside the groove; and the second electrode and the light emitting layer extend into the groove.

Optionally, the pixel definition layer is spaced apart from the insulating layer.

Optionally, the insulating island has a first side facing away to the base substrate, a second side opposite to the first side and facing the base substrate, and a third side connecting the first side and the second side; and the third side of the insulating island has a slope angle with respect to the second side of the insulating island greater than approximately 90 degrees.

Optionally, the insulating island has a first side facing away to the base substrate, a second side opposite to the first side and facing the base substrate, and a third side connecting the first side and the second side; and wherein the light emitting layer and the second electrode at least partially cover the third side of the insulating island.

Optionally, the insulating layer has a first side facing away to the base substrate, a second side opposite to the first side and facing the base substrate, and a third side connecting the first side and the second side; and the reflective layer is on the third side of the insulating layer.

Optionally, the third side is substantially flat at least in a region corresponding to a portion of the insulating layer having the height relative to the main surface of the base substrate greater than the height of the insulating island relative to the main surface of the base substrate.

Optionally, the third side of the insulating layer has a slope angle with respect to the second side of the insulating layer smaller than approximately 90 degrees.

Optionally, the reflective layer is in direct contact with the base substrate in the groove.

Optionally, the light emitting element is an organic light emitting diode comprising a first electrode, an organic light emitting layer on the first electrode, and a second electrode on a side of the organic light emitting layer away from the first electrode.

In another aspect, the present invention provides a display apparatus comprising the pixel structure described herein or fabricated by a method described herein.

In another aspect, the present invention provides a method of fabricating a pixel structure, comprising forming an insulating island on a base substrate; forming a light emitting element on a side of the insulating island away from the base substrate; forming an insulating layer on the base substrate and surrounding the insulating island, the insulating layer formed to be spaced apart from the insulating island by a groove; and forming a reflective layer on a lateral side of the insulating layer surrounding a periphery of the light emitting element, and configured to reflect light laterally emitted the light emitting element to exit from a light emitting surface of the pixel structure; wherein the insulating layer is formed to have a height relative to a main surface of the base substrate greater than a height of the insulating island relative to the main surface of the base substrate.

Optionally, forming the light emitting element comprises forming a first electrode, forming a light emitting layer on the first electrode, and forming a second electrode on a side of the light emitting layer away from the first electrode; wherein the first electrode is formed to be disconnected from the reflective layer; and the height of the insulating layer relative to the main surface of the base substrate is greater than a height of the light emitting layer relative to the main surface of the base substrate in a region sandwiched between the first electrode and the second electrode; subsequent to forming the first electrode, the method further comprises forming a pixel definition layer defining a pixel aperture; wherein the light emitting layer is formed in the pixel aperture; and the pixel definition layer is formed on a side of the first electrode away from the insulating island.

Optionally, the reflective layer and the first electrode are formed in a same patterning step using a same electrode material.

Optionally, the insulating island is formed to have a first side facing away to the base substrate, a second side opposite to the first side and facing the base substrate, and a third side connecting the first side and the second side; and the third side of the insulating island has a slope angle with respect to the second side of the insulating island greater than approximately 90 degrees; wherein forming the reflective layer and the first electrode comprises depositing an electrode material layer on the insulating island and the insulating layer, the electrode material layer discontinues at the groove, thereby separating the reflective layer from the first electrode.

Optionally, the pixel definition layer is at least partially formed in the groove, spacing apart the insulating layer and the reflective layer from the insulating island.

Optionally, the pixel definition layer is formed substantially outside the groove; and the second electrode and the light emitting layer are formed to extend into the groove.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
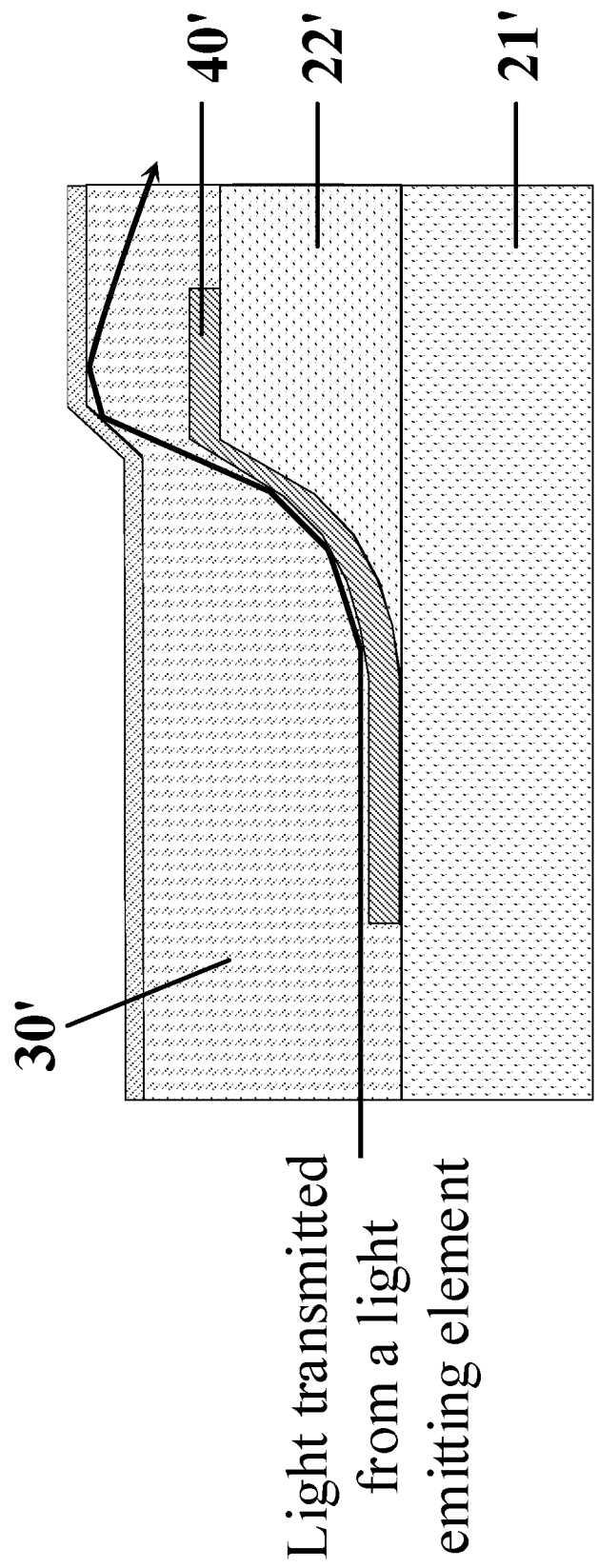
FIG. 1 is a schematic diagram of a partial structure of a conventional pixel structure.

FIG. 1 is a schematic diagram of a partial structure of a related pixel structure at an interface between a subpixel region and an inter-subpixel region in a subpixel of a display substrate. Referring to FIG. 1, the related pixel structure at the interface includes a first insulating layer 21', a second insulating layer 22' on the first insulating layer 21', a reflective layer 40' on a lateral side of the second insulating layer 22', and a pixel definition layer 30' on a side of the second insulating layer 22' and the reflective layer 40' away from the first insulating layer 21'. The refractive index of a light emitting element (e.g., the refractive index of an organic function layer in an organic light emitting diode) is much greater than the refractive index of an outside medium (e.g., air or a passivation layer). As a result, light emitted from a light emitting element can exit from a light emitting surface of the pixel structure only when an incident angle of the emitted light is within a certain range. Light emitted from the light emitting element having an incident angle outside the certain range undergoes a total reflection on the interface between the light emitting element and the outside medium. The light which is totally reflected is transmitted inside the light emitting element, which functions as a waveguide from guiding the emitted light. At the interface of the light emitting element and a pixel definition layer 30', the light continues to transmit from the light emitting element to the pixel definition layer 30' due to the similarity between refractive indexes of the light emitting element and the pixel definition layer 30'.

The light beam in the pixel definition layer 30' continues to transmit through the pixel definition layer 30', which functions as a waveguide. Absent the reflective layer 40', the light beam will transmit into the second insulating layer 22' along a lateral direction (e.g., substantially perpendicular to a light emitting direction required for an effective display of the pixel structure). The laterally transmitted light beam will be eventually dissipated in the pixel structure, resulting in light leakage or waste of energy.

The reflective layer 40' in FIG. 1 is intended to reflect light laterally emitted from the light emitting element to exit from a light emitting surface of the pixel structure. However, when forming the second insulating layer 22', a sharp edge with substantially flat surface on a lateral side of the second insulating layer 22' is usually impossible, due to residual material remaining on the lateral side after patterning the second insulating layer 22'. As a result, the lateral side of the second insulating layer 22' typically has a curved surface as shown in FIG. 1.

Subsequently, the reflective layer 40' is formed on the lateral side of the second insulating layer 22'. Because the lateral side of the second insulating layer 22' has a curved surface, the reflective layer 40' also has a curved surface. When light emitted from the light emitting element is laterally transmitted through the pixel definition layer 30', it will be reflected by the curved surface of the reflective layer 40', the light path will be substantially along the surface curvature of the reflective layer 40'. As a result, the light laterally emitted from the light emitting element would not be reflected by the reflective layer 40' to exit from a light emitting surface of the pixel structure, but will continue to transmit laterally inside the pixel structure (e.g., inside the pixel definition layer 30' as shown in FIG. 1), resulting in light leakage.

Accordingly, the present disclosure provides, inter alia, a pixel structure, a display apparatus, and a method of fabricating a pixel structure that substantially obviate one or more of the problems due to limitations and disadvantages of the related art. In one aspect, the present disclosure provides a novel pixel structure. In some embodiments, the pixel structure includes a base substrate; an insulating island on the base substrate; a light emitting element on a side of the insulating island away from the base substrate; an insulating layer on the base substrate and surrounding the insulating island, the insulating layer spaced apart from the insulating island by a groove; and a reflective layer on a lateral side of the insulating layer surrounding a periphery of the light emitting element, and configured to reflect light laterally emitted from the light emitting element to exit from a light emitting surface of the pixel structure. Optionally, the insulating layer has a height relative to a main surface of the base substrate greater than a height of the insulating island relative to the main surface of the base substrate.

Figure 2A:
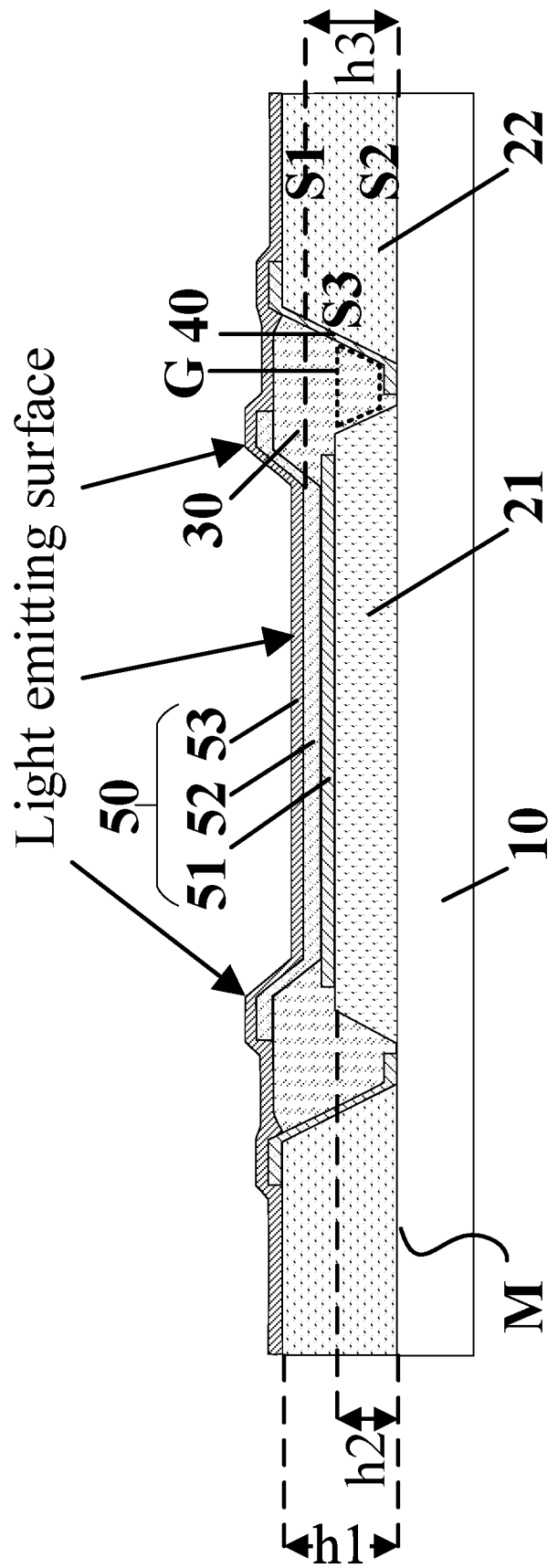
FIG. 2A is a schematic diagram of a pixel structure in some embodiments according to the present disclosure.
Figure 2B:
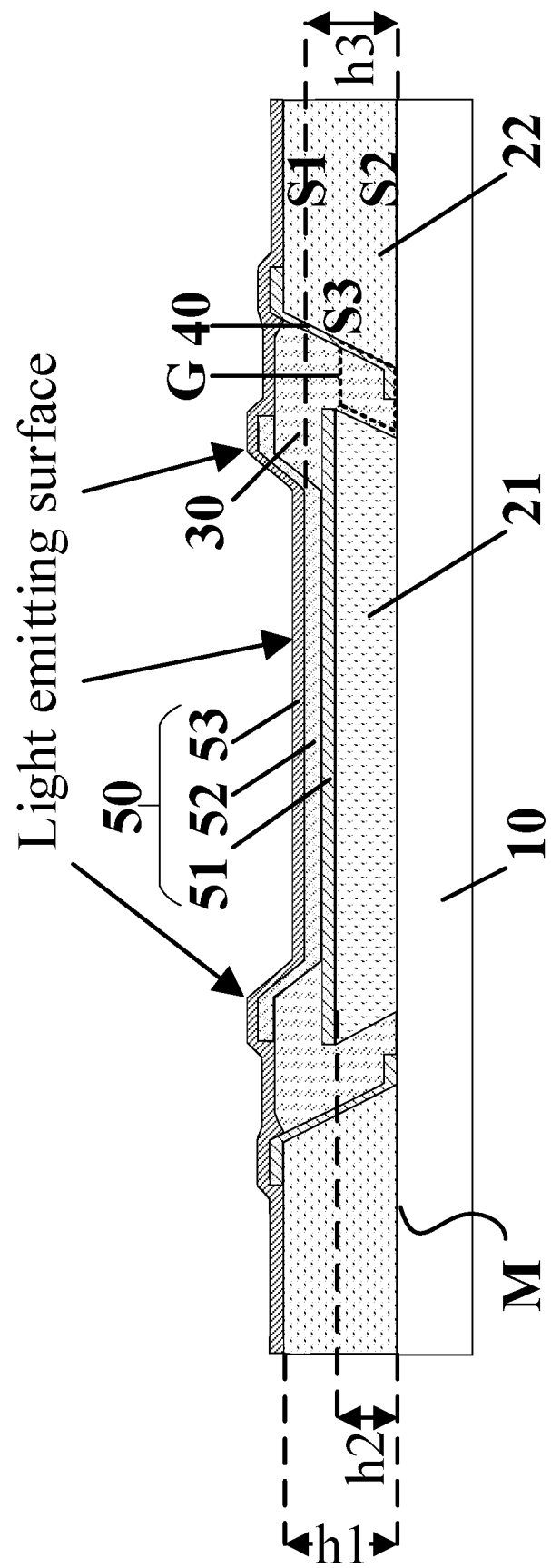
FIG. 2B is a schematic diagram of a pixel structure in some embodiments according to the present disclosure.
Figure 2C:
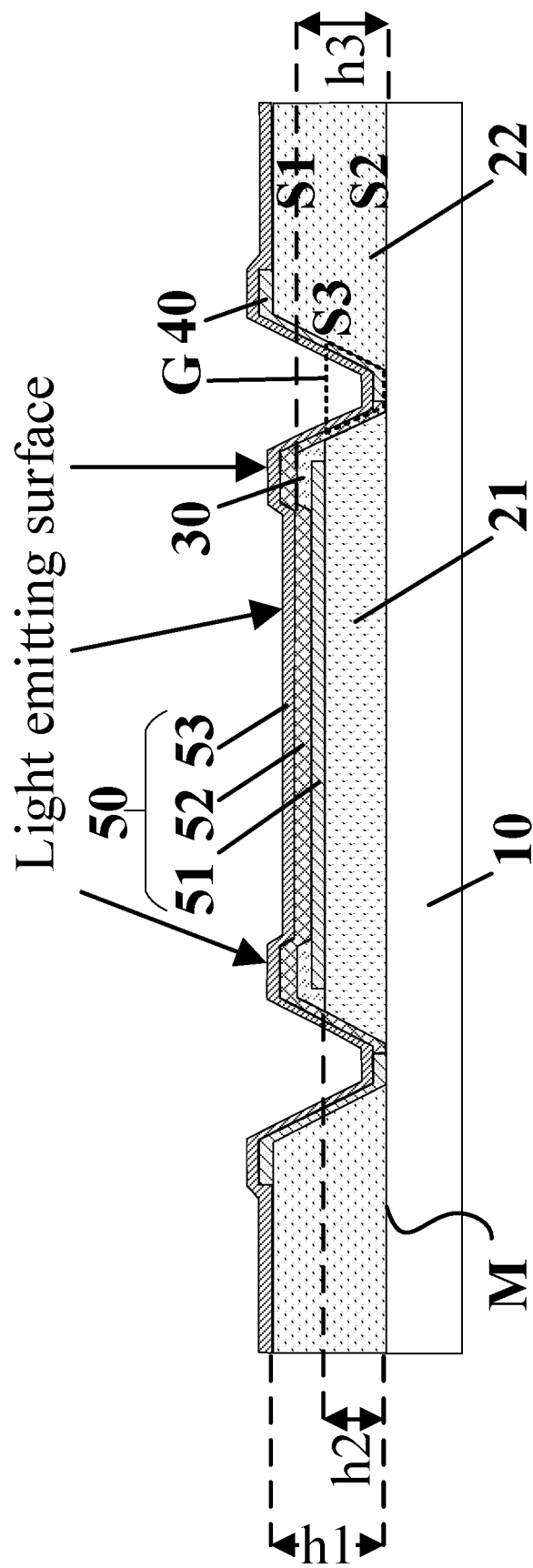
FIG. 2C is a schematic diagram of a pixel structure in some embodiments according to the present disclosure.

FIGS. 2A to 2C are schematic diagrams of a pixel structure in some embodiments according to the present disclosure. Referring to FIGS. 2A to 2C, the pixel structure in some embodiments includes a base substrate 10; an insulating island 21 on the base substrate 10; a light emitting element 50 on a side of the insulating island 21 away from the base substrate 10; an insulating layer 22 on the base substrate 10 and surrounding the insulating island 21. In the present pixel structure, the insulating layer 22 is spaced apart from the insulating island 21 by a groove G. The pixel structure further includes a reflective layer 40 on a lateral side of the insulating layer 22 surrounding a periphery of the light emitting element 50, and configured to reflect light laterally emitted from the light emitting element 50 to exit from a light emitting surface of the pixel structure. The insulating layer 22 has a height h1 relative to a main surface M of the base substrate 10 greater than a height h2 of the insulating island 21 relative to the main surface M of the base substrate 10. Optionally, the insulating layer 22 is spaced apart from the insulating island 21 by at least the reflective layer 40 in the groove G. Optionally, the reflective layer 40 is in direct contact with the base substrate 10 in the groove G, e.g., without any intermediate structure or component.

Referring to FIGS. 2A to 2C, the insulating layer 22 has a first side S1 facing away to the base substrate 10, a second side S2 opposite to the first side S1 and facing the base substrate 10, and a third side S3 connecting the first side S1 and the second side S2. The third side S3 is a side facing a periphery of the insulating island 21 and the periphery of the light emitting element 50. The lateral side of the insulating layer 22 surrounding a periphery of the light emitting element 50 refers to the third side S3. Optionally, the reflective layer 40 is on the third side S3 of the insulating layer 22. Optionally, the reflective layer 40 completely covers the third side S3 of the insulating layer 22. Referring to FIGS. 2A to 2C, in some embodiments, the third side S3 of the insulating layer 22 has a slope angle with respect to the second side S2 of the insulating layer 22 smaller than approximately 90 degrees, e.g., less than 80 degrees, less than 70 degrees, less than 60 degrees, less than 50 degrees, less than 40 degrees, and less than 30 degrees.

In some embodiments, an orthographic projection of the insulating island 21 on the base substrate 10 is substantially non-overlapping with an orthographic projection of the insulating layer 22 on the base substrate 10. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. Optionally, the orthographic projection of the insulating island 21 on the base substrate 10 is at least partially overlapping with an orthographic projection of the light emitting element 50 on the base substrate 10.

In some embodiments, the light emitting element includes a first electrode 51, a light emitting layer 52 on the first electrode 51, and a second electrode 53 on a side of the light emitting layer 52 away from the first electrode 51. Optionally, the first electrode 51 is disconnected from the reflective layer 40 to prevent short between the first electrode 51 and the second electrode 53. Optionally, the height h1 of the insulating layer 22 relative to the main surface M of the base substrate 10 is greater than a height h3 of the light emitting layer 52 relative to the main surface M of the base substrate 10 in a region sandwiched between the first electrode 51 and the second electrode 53.

In some embodiments, the pixel structure further includes a pixel definition layer 30 defining a pixel aperture, the light emitting layer being in the pixel aperture. Referring to FIGS. 2A to 2C, the pixel definition layer 30 in some embodiments is on a side of the first electrode 51 away from the insulating island 21. Referring to FIG. 2A and FIG. 2B, the pixel definition layer 30 in some embodiments is at least partially in the groove G. Optionally, the insulating layer 22 is spaced apart from the insulating island 21 by at least the pixel definition layer 30 and the reflective layer 40 in the groove G. Optionally, the pixel definition layer 30 in the groove G spaces apart the insulating layer 22 and the reflective layer 40 from the insulating island 21. Referring to FIG. 2C, the pixel definition layer 30 in some embodiments is substantially outside the groove G. Optionally, the second electrode 53 and the light emitting layer 52 extend into the groove G. The pixel definition layer 30 is spaced apart from the insulating layer 22, e.g., by at least the reflective layer 40 in the groove G.

Figure 3:
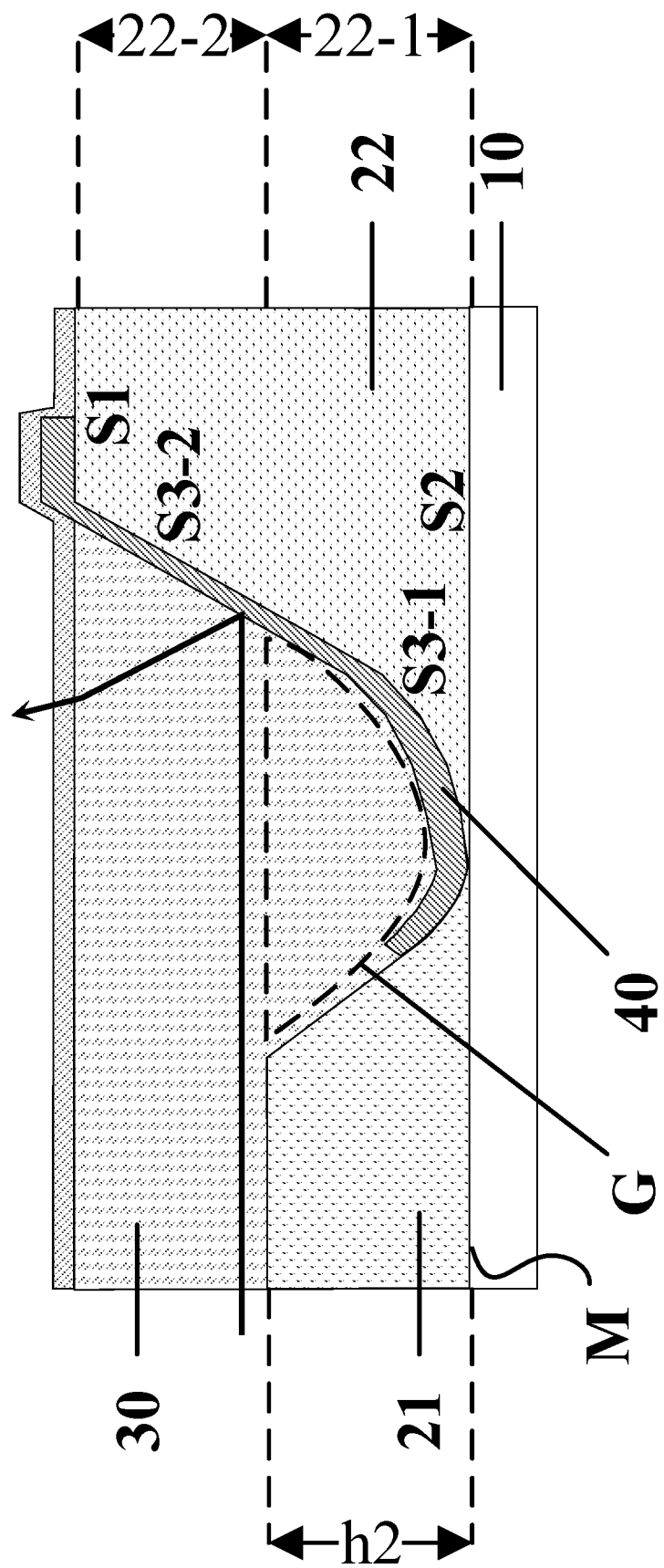
FIG. 3 is a schematic diagram of a partial structure of a pixel structure in some embodiments according to the present disclosure.

FIG. 3 is a schematic diagram of a partial structure of a pixel structure in some embodiments according to the present disclosure. Referring to FIG. 3, by having an insulating layer 22 that is spaced apart from and higher than the insulating island 21, the reflective layer 40 formed on the lateral side of the insulating layer 22 would have a substantially flat surface for reflecting light laterally emitted from the light emitting element to exit from a light emitting surface of the pixel structure. As shown in FIG. 3, the third side of the insulating layer 22 includes a first sub-side S3-1 and a second sub-side S3-2. The first sub-side S3-1 is in a region corresponding to a first portion 22-1 of the insulating layer 22 having a height relative to the main surface M of the base substrate 10 smaller than or equal to the height h2 of the insulating island 21 relative to the main surface M of the base substrate 10. The second sub-side S3-2 is in a region corresponding to a second portion 22-2 of the insulating layer 22 having a height relative to the main surface M of the base substrate 10 greater than the height h2 of the insulating island 21 relative to the main surface M of the base substrate 10. Referring to FIG. 3, the third side is substantially flat at least in the region corresponding to a portion of the insulating layer 22 having the height relative to the main surface M of the base substrate 10 greater than the height h2 of the insulating island 21 relative to the main surface M of the base substrate 10. For example, at least the second sub-side S3-2 is substantially flat.

In forming the insulating layer 22, even though the residual material still remains on the lateral side of the insulating layer 22 after patterning the insulating layer 22, the residual material substantially remains on the first sub-side S3-1 of the insulating layer 22, which is not irradiated by the light laterally emitted from the light emitting element through the pixel definition layer 30, because the pixel definition layer 30 is disposed on the insulating island 21. Thus, the curved surface of the reflective layer 40 on the first sub-side S3-1 is not configured to reflect the light laterally emitted from the light emitting element through the pixel definition layer 30. In contrast, and referring to FIG. 3, the light beam laterally emitted from the light emitting element through the pixel definition layer 30 is irradiated on the second sub-side S3-2, which is substantially flat, and reflects the light beam along a direction to exit from a light emitting surface of the pixel structure. As used herein, the term "substantially flat" refers to a surface having a curvature less than 10 degrees, e.g., less than 7.5 degrees, less than 5 degrees, less than 2.5 degrees, less than 1 degrees, and equal to zero degree.

Figure 4A:
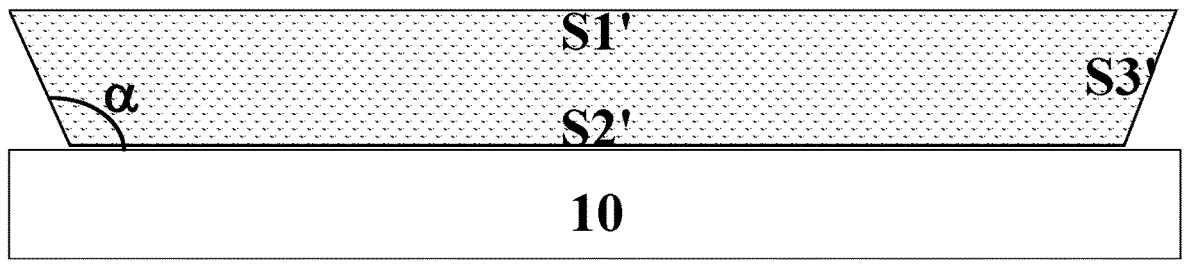
FIG. 4A is a schematic diagram of an insulating island of a pixel structure in some embodiments according to the present disclosure.

FIG. 4A is a schematic diagram of an insulating island of a pixel structure in some embodiments according to the present disclosure. Referring to FIG. 4A and FIG. 2B, the insulating island 21 in some embodiments has a side S1' facing away to the base substrate 10, a side S2' opposite to the side S1' and facing the base substrate 10, and a side S3' connecting the side S1' and the side S2'. Referring to FIG. 4A, the side S3' of the insulating island 21 in some embodiments has a slope angle α with respect to the side S2' of the insulating island 21 greater than approximately 90 degrees, e.g., greater than 100 degrees, greater than 110 degrees, greater than 120 degrees, greater than 130 degrees, greater than 140 degrees, and greater than 150 degrees. Referring to FIG. 2B, the groove G in some embodiments have a cross-section along a plane substantially perpendicular to the base substrate 10, the cross-section having a substantially parallelogram shape.

Figure 4B:
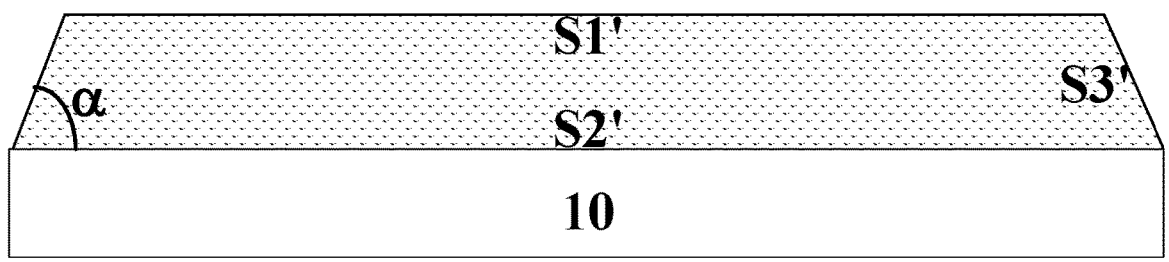
FIG. 4B is a schematic diagram of an insulating island of a pixel structure in some embodiments according to the present disclosure.

FIG. 4B is a schematic diagram of an insulating island of a pixel structure in some embodiments according to the present disclosure. Referring to FIG. 4B, FIG. 2A, and FIG. 2C, the insulating island 21 in some embodiments has a side S1' facing away to the base substrate 10, a side S2' opposite to the side S1' and facing the base substrate 10, and a side S3' connecting the side S1' and the side S2'. Referring to FIG. 4B, the side S3' of the insulating island 21 in some embodiments has a slope angle α with respect to the side S2' of the insulating island 21 less than approximately 90 degrees, e.g., less than 80 degrees, less than 70 degrees, less than 60 degrees, less than 50 degrees, less than 40 degrees, and less than 30 degrees. Referring to FIG. 2A and FIG. 2C, the groove G in some embodiments have a cross-section along a plane substantially perpendicular to the base substrate 10, the cross-section having an inverted trapezoidal shape. Referring to FIG. 4B and FIG. 2C, in some embodiments, the light emitting layer 52 and the second electrode 53 at least partially cover the side S3' of the insulating island 21.

In some embodiments, the light emitting element is an organic light emitting diode including a first electrode (e.g., an anode), an organic light emitting layer on the first electrode, and a second electrode (e.g., a cathode) on a side of the organic light emitting layer away from the first electrode.

In another aspect, the present disclosure provides a method of fabricating a pixel structure. In some embodiments, the method includes forming an insulating island on a base substrate; forming a light emitting element on a side of the insulating island away from the base substrate; forming an insulating layer on the base substrate and surrounding the insulating island, the insulating layer formed to be spaced apart from the insulating island by a groove; and forming a reflective layer on a lateral side of the insulating layer surrounding a periphery of the light emitting element, and configured to reflect light laterally emitted from the light emitting element to exit from a light emitting surface of the pixel structure. Optionally, the insulating layer is formed to have a height relative to a main surface of the base substrate greater than a height of the insulating island relative to the main surface of the base substrate.

In some embodiments, the step of forming the light emitting element includes forming a first electrode, forming a light emitting layer on the first electrode, and forming a second electrode on a side of the light emitting layer away from the first electrode. Optionally, the first electrode is formed to be disconnected from the reflective layer. Optionally, the insulating island and the insulating layer are formed so that the height of the insulating layer relative to the main surface of the base substrate is greater than a height of the light emitting layer relative to the main surface of the base substrate in a region sandwiched between the first electrode and the second electrode.

In some embodiments, the method further includes forming a pixel definition layer defining a pixel aperture. The light emitting layer is formed in the pixel aperture, and the pixel definition layer is formed on a side of the first electrode away from the insulating island.

In some embodiments, the reflective layer and the first electrode are formed in a same patterning step using a same electrode material.

In some embodiments, the insulating island is formed to have a first side facing away to the base substrate, a second side opposite to the first side and facing the base substrate, and a third side connecting the first side and the second side. Optionally, the third side of the insulating island has a slope angle with respect to the second side of the insulating island greater than approximately 90 degrees. Optionally, forming the reflective layer and the first electrode includes depositing an electrode material layer on the insulating island and the insulating layer, the electrode material layer discontinues at the groove, thereby separating the reflective layer from the first electrode.

In some embodiments, the pixel definition layer is at least partially formed in the groove, spacing apart the insulating layer and the reflective layer from the insulating island.

In some embodiments, the pixel definition layer is formed substantially outside the groove; and the second electrode and the light emitting layer are formed to extend into the groove.

Figure 5A:
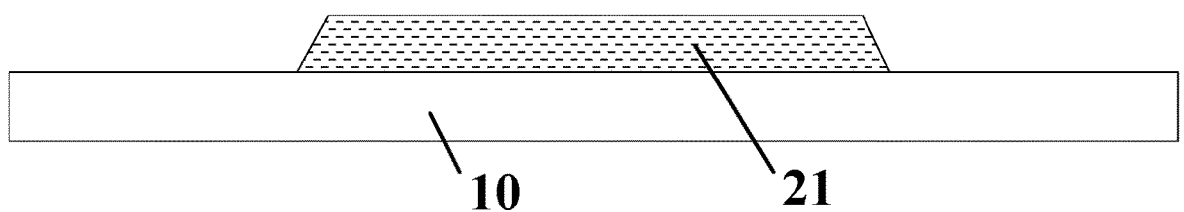
FIGS. 5A to 5D illustrate a method of fabricating a pixel structure in some embodiments according to the present disclosure.
Figure 5B:
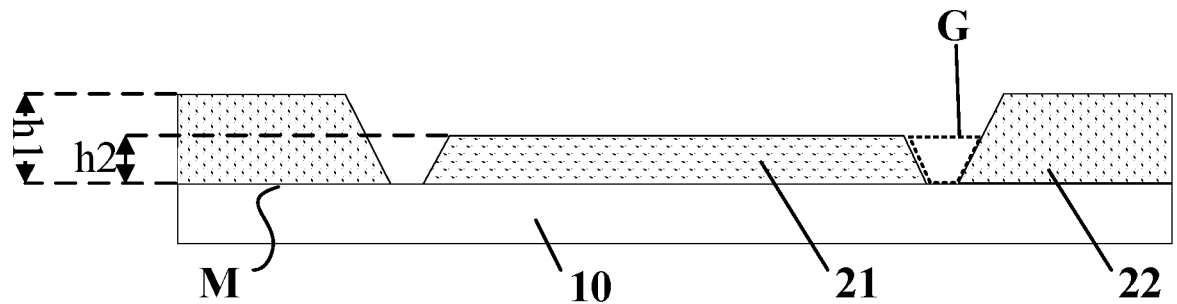
Figure 5C:
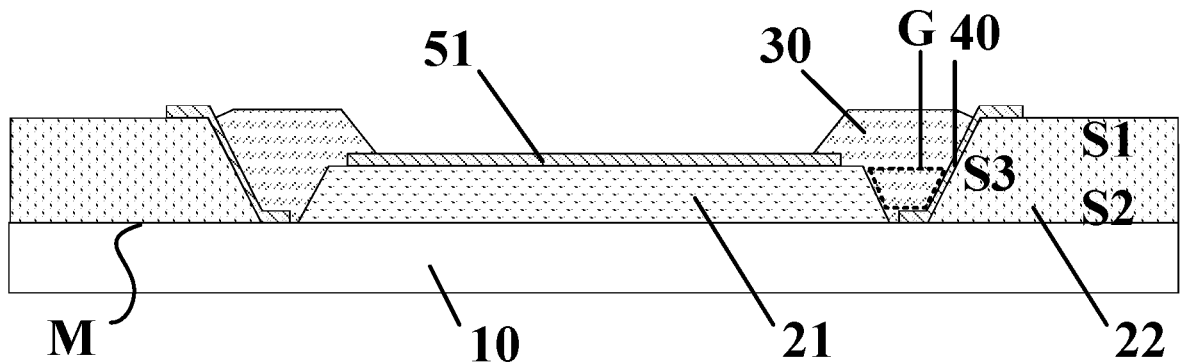

FIGS. 5A to 5D illustrate a method of fabricating a pixel structure in some embodiments according to the present disclosure. Referring to FIG. 5A, an insulating island 21 is formed on a base substrate 10. Optionally, the insulating island 21 may be formed by coating an insulating material layer on the base substrate 10, followed by a lithography process including exposure and development to pattern the insulating material layer. Referring to FIG. 5B, subsequent to forming the insulating island 21, an insulating layer 22 is formed on the base substrate 10. The insulating layer 22 is formed to surround the insulating island 21, the insulating layer 22 spaced apart from the insulating island 21 by a groove G. The insulating layer 22 is formed to have a height h1 relative to a main surface M of the base substrate 10 greater than a height h2 of the insulating island 21 relative to the main surface M of the base substrate 10. Referring to FIG. 5C, a reflective layer 40 and a first electrode 51 are formed in a single patterning step using a same material and using a same mask plate. The reflective layer 40 is formed on a lateral side of the insulating layer 22 surrounding a periphery of the insulating island 21. The first electrode 51 is formed on the insulating island 21, an orthographic projection of the insulating island 21 on the base substrate 10 substantially covers an orthographic projection of the first electrode 51 on the base substrate 10. The first electrode 51 is formed to be disconnected from the reflective layer 40.

Various appropriate reflective conductive materials and various appropriate fabricating methods may be used to make the metal electrode segment. For example, a reflective conductive material may be deposited on the substrate by a plasma-enhanced chemical vapor deposition (PECVD) process. Examples of appropriate reflective conductive materials include, but are not limited to, a metal material such as copper, aluminum, silver, molybdenum, chromium, neodymium, nickel, manganese, titanium, tantalum, and tungsten.

Various appropriate insulating materials and various appropriate fabricating methods may be used to make the insulating island and the insulating layer. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Referring to FIG. 5C, subsequent to forming the first electrode 51, a pixel definition layer 30 for defining a pixel aperture is formed on a side of the first electrode 51 away from the insulating island 21. In this example, the pixel definition layer 30 is formed to extend into the groove G, however, the pixel definition layer 30 is not in direct contact with the insulating layer 22. Rather, the pixel definition layer 30 is formed to be spaced apart from the insulating layer 22 by the reflective layer 40 in the groove G.

Various appropriate insulating materials and various appropriate fabricating methods may be used to make the pixel definition layer. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Figure 5D:
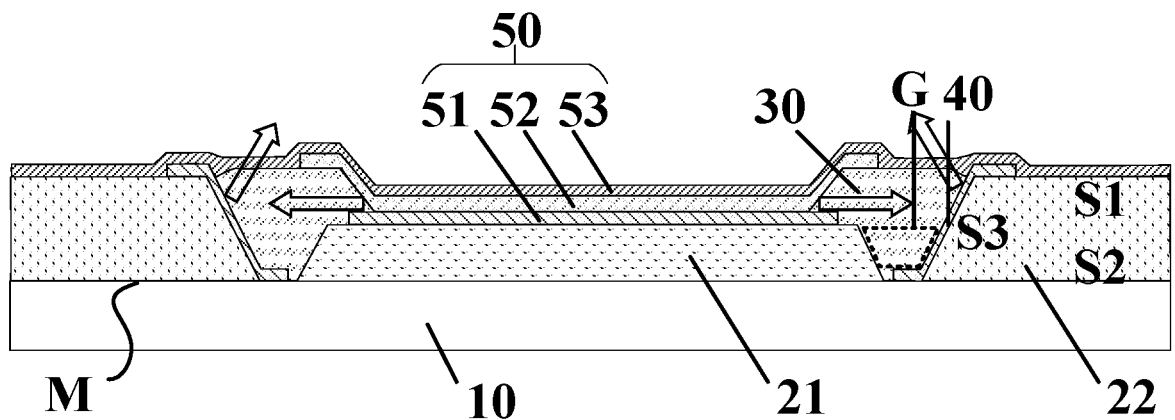

Referring to FIG. 5D, subsequent to forming the pixel definition layer 30, a light emitting layer 52 is formed on a side of the first electrode 51 away from the insulating island 21, and a second electrode 53 is formed on a side of the light emitting layer 52 away from the first electrode 51. Optionally, the second electrode 53 is formed to substantially cover the light emitting surface of the pixel structure.

Various appropriate reflective conductive materials and various appropriate fabricating methods may be used to make the second electrode. For example, a transparent conductive material may be deposited on the substrate by a plasma-enhanced chemical vapor deposition (PECVD) process. Examples of appropriate transparent conductive materials include, but are not limited to, various transparent metallic electrode materials, transparent metal oxide electrode materials and transparent nano-carbon tubes. Examples of transparent metallic electrode materials include silver and magnesium/silver alloy or laminate. Examples of transparent metal oxide materials include, but are not limited to, indium tin oxide, indium zinc oxide, indium gallium oxide, and indium gallium zinc oxide.

Optionally, the light emitting layer 52 is an organic light emitting layer. As shown in FIG. 5D, light laterally emitted from the light emitting element 50 is reflected by the reflective layer 40 along a direction to exit from a light emitting surface of the pixel structure (light beam shown in arrows).

In FIGS. 5A to 5D, the insulating island 21 and the insulating layer 22 may be formed using a positive photoresist material, and the insulating island 21 and the insulating layer 22 are formed to have an overcut profile, e.g., the insulating island 21 and the insulating layer 22 are formed to have a cross-section along a plane substantially perpendicular to the base substrate 10, the cross-section having a trapezoidal shape.

Figure 6A:
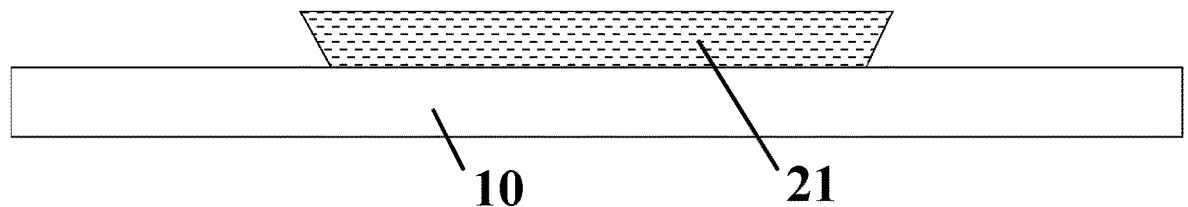
FIGS. 6A to 6D illustrate a method of fabricating a pixel structure in some embodiments according to the present disclosure.

FIGS. 6A to 6D illustrate a method of fabricating a pixel structure in some embodiments according to the present disclosure. Referring to FIG. 6A, an insulating island 21 is formed on a base substrate 10. In this embodiment, the insulating island 21 is formed to have an undercut profile. For example, the insulating island 21 may be formed by coating a negative photoresist material layer on the base substrate 10. The negative photoresist material layer is then patterned using a lithography process including exposure and development to pattern the negative photoresist material layer to form an insulating island 21 having an undercut profile, e.g., the insulating island 21 is formed to have a cross-section along a plane substantially perpendicular to the base substrate 10, the cross-section having an inverted trapezoidal shape.

Figure 6B:
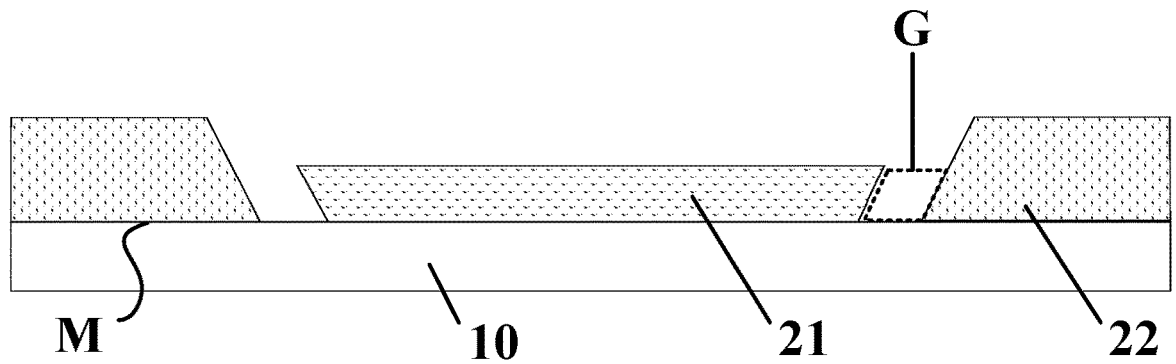

Referring to FIG. 6B, subsequent to forming the insulating island 21, an insulating layer 22 is formed on the base substrate 10. The insulating layer 22 may be formed using a positive photoresist material by coating a positive photoresist material layer on the base substrate 10. The insulating layer 22 is formed to have an overcut profile, e.g., the insulating layer 22 is formed to have a cross-section along a plane substantially perpendicular to the base substrate 10, the cross-section having a trapezoidal shape. The insulating layer 22 is formed to surround the insulating island 21, the insulating layer 22 spaced apart from the insulating island 21 by a groove G. Referring to FIG. 6B, the groove G in some embodiments have a cross-section along a plane substantially perpendicular to the base substrate 10, the cross-section having a substantially parallelogram shape. The insulating layer 22 is formed to have a height h1 relative to a main surface M of the base substrate 10 greater than a height h2 of the insulating island 21 relative to the main surface M of the base substrate 10.

Figure 6C:
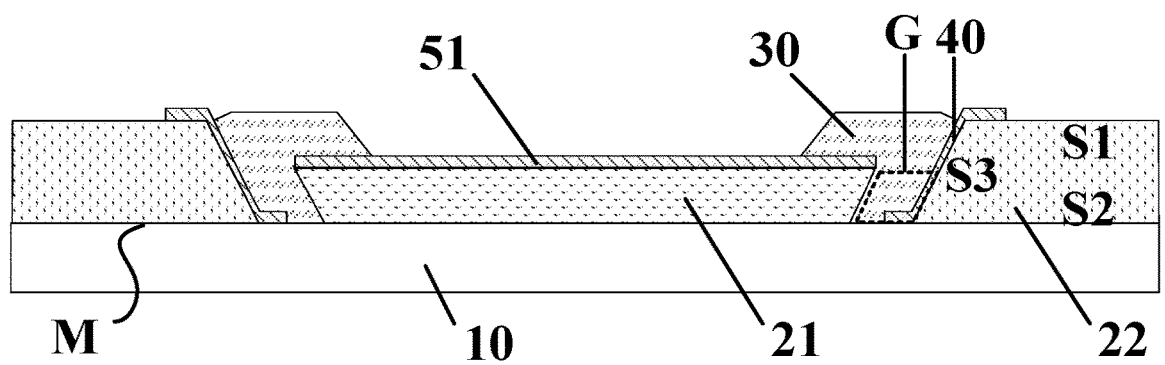

Referring to FIG. 6C, a reflective layer 40 and a first electrode 51 are formed in a single patterning step using a same material and using a same mask plate. The reflective layer 40 is formed on a lateral side of the insulating layer 22 surrounding a periphery of the insulating island 21. The first electrode 51 is formed on the insulating island 21, an orthographic projection of the insulating island 21 on the base substrate 10 substantially covers an orthographic projection of the first electrode 51 on the base substrate 10. The first electrode 51 is formed to be disconnected from the reflective layer 40. In this embodiment, because the groove G has a cross-section having a substantially parallelogram shape and the insulating island 21 has an undercut profile, the conductive material for forming the reflective layer 40 and the first electrode 51, when deposited on the substrate, naturally discontinues at the groove G, thereby separating the reflective layer 40 from the first electrode 51.

Referring to FIG. 6C, subsequent to forming the first electrode 51, a pixel definition layer 30 for defining a pixel aperture is formed on a side of the first electrode 51 away from the insulating island 21. In this example, the pixel definition layer 30 is formed to extend into the groove G, however, the pixel definition layer 30 is not in direct contact with the insulating layer 22. Rather, the pixel definition layer 30 is formed to be spaced apart from the insulating layer 22 by the reflective layer 40 in the groove G.

Figure 6D:
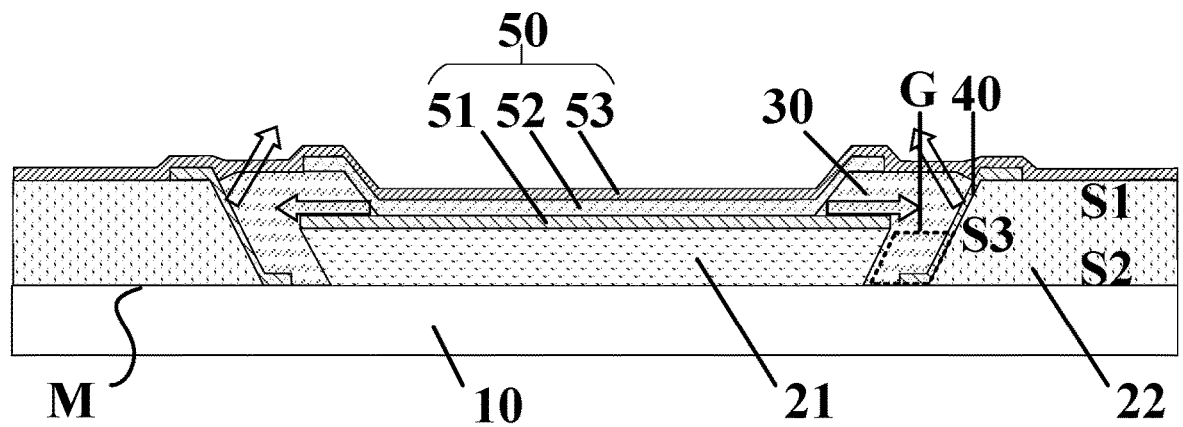

Referring to FIG. 6D, subsequent to forming the pixel definition layer 30, a light emitting layer 52 is formed on a side of the first electrode 51 away from the insulating island 21, and a second electrode 53 is formed on a side of the light emitting layer 52 away from the first electrode 51. Optionally, the second electrode 53 is formed to substantially cover the light emitting surface of the pixel structure. As shown in FIG. 6D, light laterally emitted from the light emitting element 50 is reflected by the reflective layer 40 along a direction to exit from a light emitting surface of the pixel structure (light beam shown in arrows).

Figure 7A:
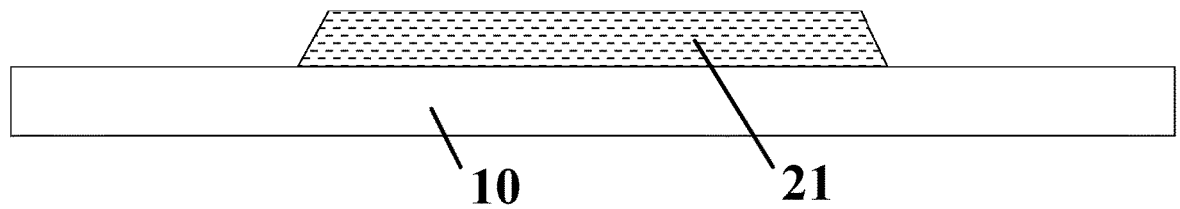
FIGS. 7A to 7D illustrate a method of fabricating a pixel structure in some embodiments according to the present disclosure.
Figure 7B:
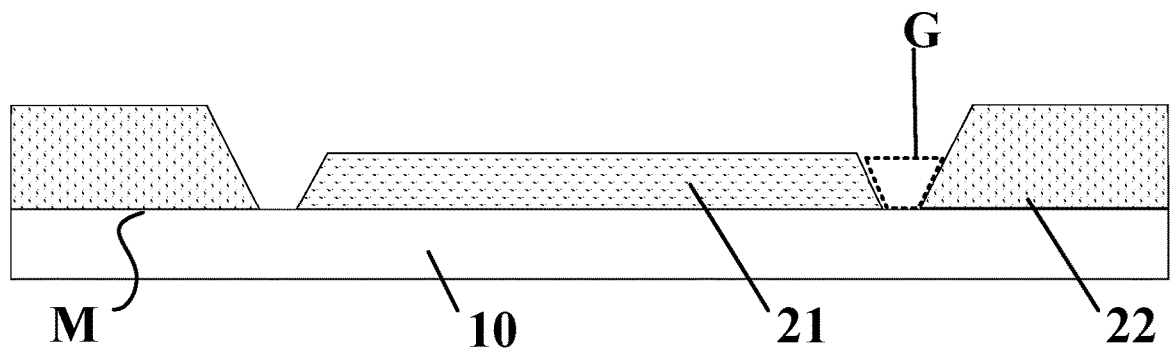
Figure 7C:
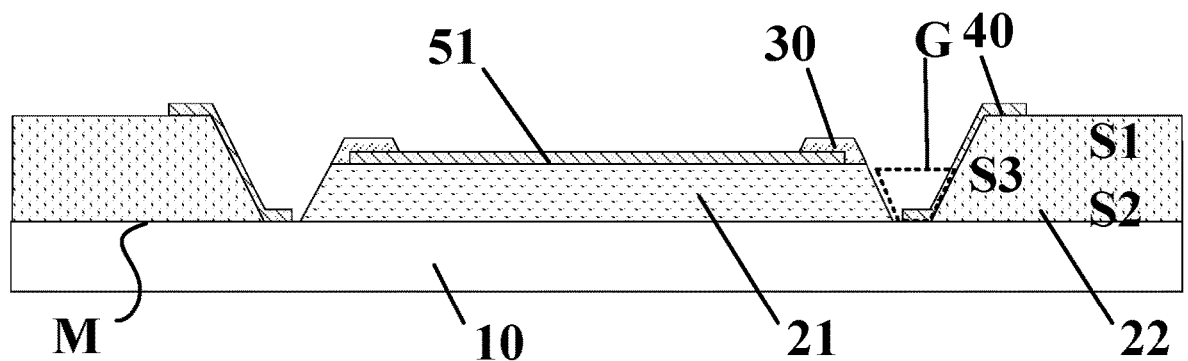

FIGS. 7A to 7D illustrate a method of fabricating a pixel structure in some embodiments according to the present disclosure. The processes shown in FIG. 7A and FIG. 7B are largely similar to those of FIG. 5A and FIG. 5B, respectively. Referring to FIG. 7C, subsequent to forming the first electrode 51, a pixel definition layer 30 for defining a pixel aperture is formed on a side of the first electrode 51 away from the insulating island 21. In this example, the pixel definition layer 30 is formed substantially outside the groove G. Thus, the pixel definition layer 30 is formed not to cover the reflective layer 40, but formed in a region limited to cover a periphery of the first electrode 51 on the insulating island 21. The pixel definition layer 30 is formed to be spaced apart from the insulating layer 22 by the reflective layer 40 in the groove G.

Figure 7D:
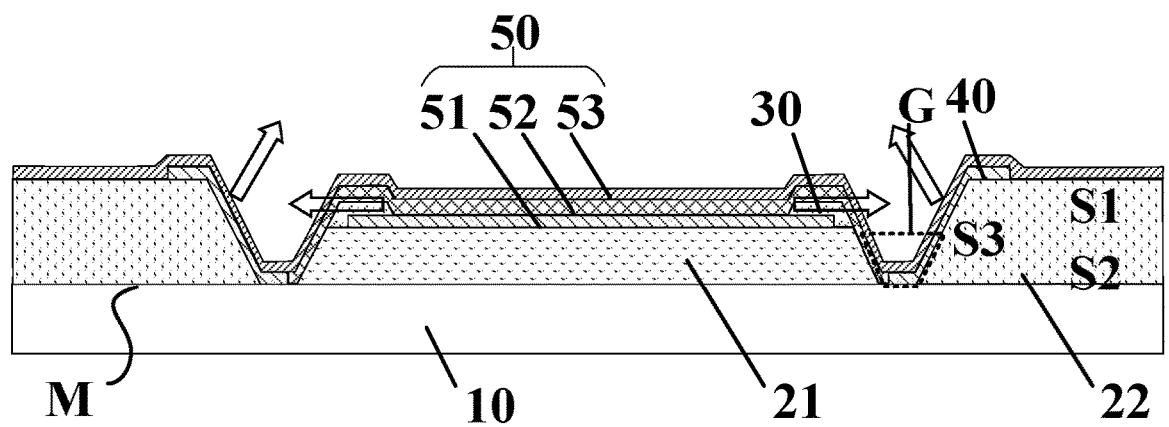

Referring to FIG. 7D, subsequent to forming the pixel definition layer 30, a light emitting layer 52 is formed on a side of the first electrode 51 away from the insulating island 21, and a second electrode 53 is formed on a side of the light emitting layer 52 away from the first electrode 51. In this embodiment, the light emitting layer 52 and the second electrode 53 are formed to extend into the groove G. Optionally, the second electrode 53 is formed to substantially cover the light emitting surface of the pixel structure. As shown in FIG. 7D, light laterally emitted from the light emitting element 50 is reflected by the reflective layer 40 along a direction to exit from a light emitting surface of the pixel structure (light beam shown in arrows).

In another aspect, the present disclosure provides a display substrate having the pixel structure described herein or fabricated by a method described herein. In another aspect, the present disclosure provides a display panel having the pixel structure described herein or fabricated by a method described herein. In another aspect, the present disclosure provides a display apparatus having the pixel structure described herein or fabricated by a method described herein. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel structure, comprising:
a base substrate;
an insulating island on the base substrate;
a light emitting element on a side of the insulating island away from the base substrate;
an insulating layer on the base substrate and surrounding the insulating island, the insulating layer spaced apart from the insulating island by a groove; and
a reflective layer on a lateral side of the insulating layer surrounding a periphery of the light emitting element, and configured to reflect light laterally emitted from the light emitting element to exit from a light emitting surface of the pixel structure;
wherein the insulating layer has a height relative to a main surface of the base substrate greater than a height of the insulating island relative to the main surface of the base substrate; and
the reflective layer is in direct contact with the base substrate in the groove.

2. The pixel structure of claim 1, wherein the light emitting element comprises a first electrode, a light emitting layer on the first electrode, and a second electrode on a side of the light emitting layer away from the first electrode;
the first electrode is disconnected from the reflective layer; and
the height of the insulating layer relative to the main surface of the base substrate is greater than a height of the light emitting layer relative to the main surface of the base substrate in a region sandwiched between the first electrode and the second electrode.

3. The pixel structure of claim 2, further comprising a pixel definition layer defining a pixel aperture;
wherein the light emitting layer is in the pixel aperture; and
the pixel definition layer is on a side of the first electrode away from the insulating island.

4. The pixel structure of claim 3, wherein the pixel definition layer is at least partially in the groove, spacing apart the insulating layer and the reflective layer from the insulating island.

5. The pixel structure of claim 3, wherein the pixel definition layer is substantially outside the groove; and
the second electrode and the light emitting layer extend into the groove.

6. The pixel structure of claim 3, wherein the pixel definition layer is spaced apart from the insulating layer.

7. The pixel structure of claim 1, wherein the insulating island has a first side facing away to the base substrate, a second side opposite to the first side and facing the base substrate, and a third side connecting the first side and the second side; and the third side of the insulating island has a slope angle with respect to the second side of the insulating island greater than approximately 90 degrees.

8. The pixel structure of claim 2, wherein the insulating island has a first side facing away to the base substrate, a second side opposite to the first side and facing the base substrate, and a third side connecting the first side and the second side; and wherein the light emitting layer and the second electrode at least partially cover the third side of the insulating island.

9. The pixel structure of claim 1, wherein the insulating layer has a first side facing away to the base substrate, a second side opposite to the first side and facing the base substrate, and a third side connecting the first side and the second side; and the reflective layer is on the third side of the insulating layer.

10. The pixel structure of claim 9, wherein the third side is substantially flat at least in a region corresponding to a portion of the insulating layer having the height relative to the main surface of the base substrate greater than the height of the insulating island relative to the main surface of the base substrate.

11. The pixel structure of claim 9, wherein the third side of the insulating layer has a slope angle with respect to the second side of the insulating layer smaller than approximately 90 degrees.

12. The pixel structure of claim 1, wherein the light emitting element is an organic light emitting diode comprising a first electrode, an organic light emitting layer on the first electrode, and a second electrode on a side of the organic light emitting layer away from the first electrode.

13. A display apparatus, comprising the pixel structure of claim 1.

14. A method of fabricating a pixel structure, comprising:
forming an insulating island on a base substrate;
forming a light emitting element on a side of the insulating island away from the base substrate;
forming an insulating layer on the base substrate and surrounding the insulating island, the insulating layer formed to be spaced apart from the insulating island by a groove; and
forming a reflective layer on a lateral side of the insulating layer surrounding a periphery of the light emitting element, and configured to reflect light laterally emitted from the light emitting element to exit from a light emitting surface of the pixel structure;
wherein the insulating layer is formed to have a height relative to a main surface of the base substrate greater than a height of the insulating island relative to the main surface of the base substrate; and
the reflective layer is in direct contact with the base substrate in the groove.

15. The method of claim 14, wherein forming the light emitting element comprises forming a first electrode, forming a light emitting layer on the first electrode, and forming a second electrode on a side of the light emitting layer away from the first electrode;

wherein the first electrode is formed to be disconnected from the reflective layer; and
the height of the insulating layer relative to the main surface of the base substrate is greater than a height of the light emitting layer relative to the main surface of the base substrate in a region sandwiched between the first electrode and the second electrode;
subsequent to forming the first electrode, the method further comprises forming a pixel definition layer defining a pixel aperture;
wherein the light emitting layer is formed in the pixel aperture; and
the pixel definition layer is formed on a side of the first electrode away from the insulating island.

16. The method of claim 15, wherein the reflective layer and the first electrode are formed in a same patterning step using a same electrode material.

17. The method of claim 16, wherein the insulating island is formed to have a first side facing away to the base substrate, a second side opposite to the first side and facing the base substrate, and a third side connecting the first side and the second side; and the third side of the insulating island has a slope angle with respect to the second side of the insulating island greater than approximately 90 degrees;
wherein forming the reflective layer and the first electrode comprises depositing an electrode material layer on the insulating island and the insulating layer, the electrode material layer discontinues at the groove, thereby separating the reflective layer from the first electrode.

18. The method of claim 15, wherein the pixel definition layer is at least partially formed in the groove, spacing apart the insulating layer and the reflective layer from the insulating island.

19. The method of claim 15, wherein the pixel definition layer is formed substantially outside the groove; and the second electrode and the light emitting layer are formed to extend into the groove.

* * * * *